(12) United States Patent
Yeh et al.

(10) Patent No.: US 10,512,180 B2
(45) Date of Patent: Dec. 17, 2019

(54) SECURITY SYSTEM FOR ELECTRONICS CABINET

(71) Applicant: CommScope Technologies LLC, Hickory, NC (US)

(72) Inventors: Jer-Haw J. Yeh, Plano, TX (US); Alfred W. King, Allen, TX (US); Komen Shliker, Plano, TX (US); Willis Frank James, Wylie, TX (US); Charles John Mann, Omaha, NE (US)

(73) Assignee: CommScope Technologies LLC, Hickory, NC (US)

(*) Notice: Subject to any disclaimer, the term of this patent is extended or adjusted under 35 U.S.C. 154(b) by 0 days.

(21) Appl. No.: 15/972,652

(22) Filed: May 7, 2018

(65) Prior Publication Data

US 2018/0338380 A1 Nov. 22, 2018

Related U.S. Application Data

(60) Provisional application No. 62/507,280, filed on May 17, 2017.

(51) Int. Cl.
 *E05B 67/06* (2006.01)
 *H05K 5/02* (2006.01)
 *F16B 1/00* (2006.01)
 *F16B 7/22* (2006.01)

(52) U.S. Cl.
 CPC ............. *H05K 5/0208* (2013.01); *F16B 1/00* (2013.01); *F16B 7/22* (2013.01); *H05K 5/0221* (2013.01); *F16B 2001/0035* (2013.01)

(58) Field of Classification Search
 CPC .... H05K 5/0208; H05K 5/0221; H05K 7/186; H05K 7/20136; F16B 1/00; F16B 7/22; F16B 2001/0035; E05B 67/383; E05B 67/06; E05Y 2900/208
 USPC .................. 70/2, 53, 56, 208; 292/288–290; 361/692
 See application file for complete search history.

(56) References Cited

U.S. PATENT DOCUMENTS

| | | | |
|---|---|---|---|
| 5,447,346 A * | 9/1995 | Virzi | E05B 65/0888 292/258 |
| 5,462,323 A * | 10/1995 | Benninger | B60J 1/1853 292/266 |
| 6,018,968 A * | 2/2000 | Sides | E05B 67/36 292/288 |
| 6,983,629 B1 * | 1/2006 | Gogel | E05C 19/186 292/258 |

(Continued)

*Primary Examiner* — Suzanne L Barrett
(74) *Attorney, Agent, or Firm* — Myers Bigel, P.A.

(57) ABSTRACT

An electronics cabinet includes front, rear and side walls, wherein the rear wall includes first and second removable panels, the first and second removable panels being mounted to the rear wall with securing fasteners and further includes a security system for preventing removal of the first and second removable panels. The security system includes: an assembly that overlies a securing fastener of the first panel and a securing fastener of the second panel; and a locking device engaging the assembly, the locking device configured to move between locked and unlocked conditions, wherein in the locked condition the locking device prevents removal of the assembly from the first and second rear panels, and in the unlocked condition the locking device permits the removal of the assembly from the first and second rear panels.

17 Claims, 9 Drawing Sheets

(56) References Cited

U.S. PATENT DOCUMENTS

| | | | | |
|---|---|---|---|---|
| 7,497,490 B2* | 3/2009 | Yamaguchi | ............ | E05C 17/30 |
| | | | | 292/259 R |
| 8,245,546 B2* | 8/2012 | Olsson | ................... | E05B 67/38 |
| | | | | 292/1 |
| 2006/0272365 A1* | 12/2006 | Copus | ................... | E05B 13/002 |
| | | | | 70/14 |
| 2012/0235427 A1* | 9/2012 | Miskel | ................. | E05C 19/186 |
| | | | | 292/288 |

* cited by examiner

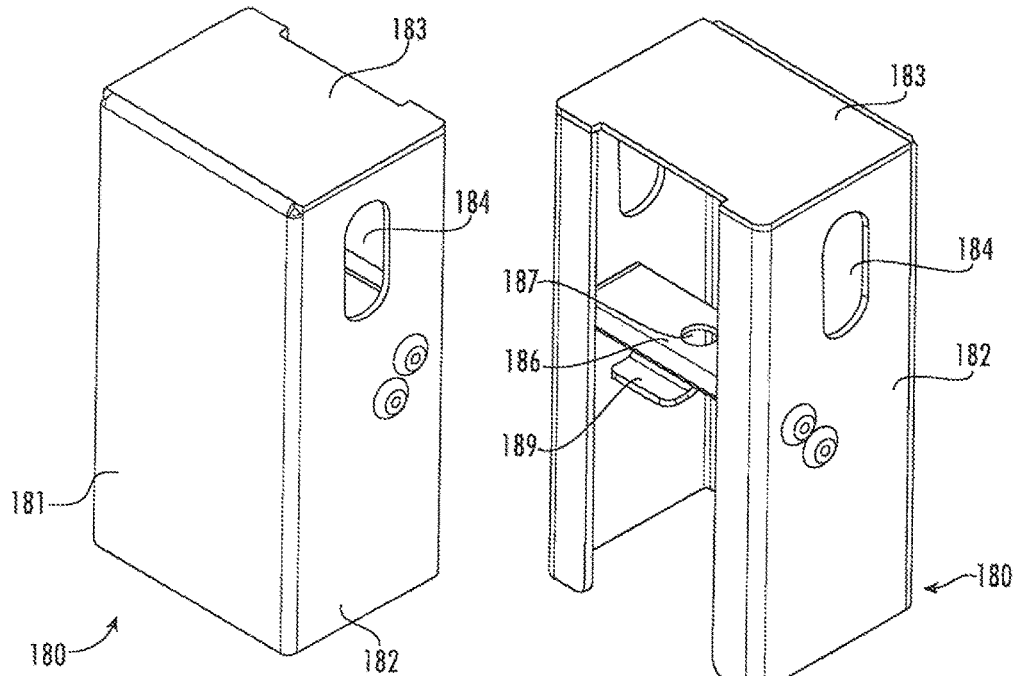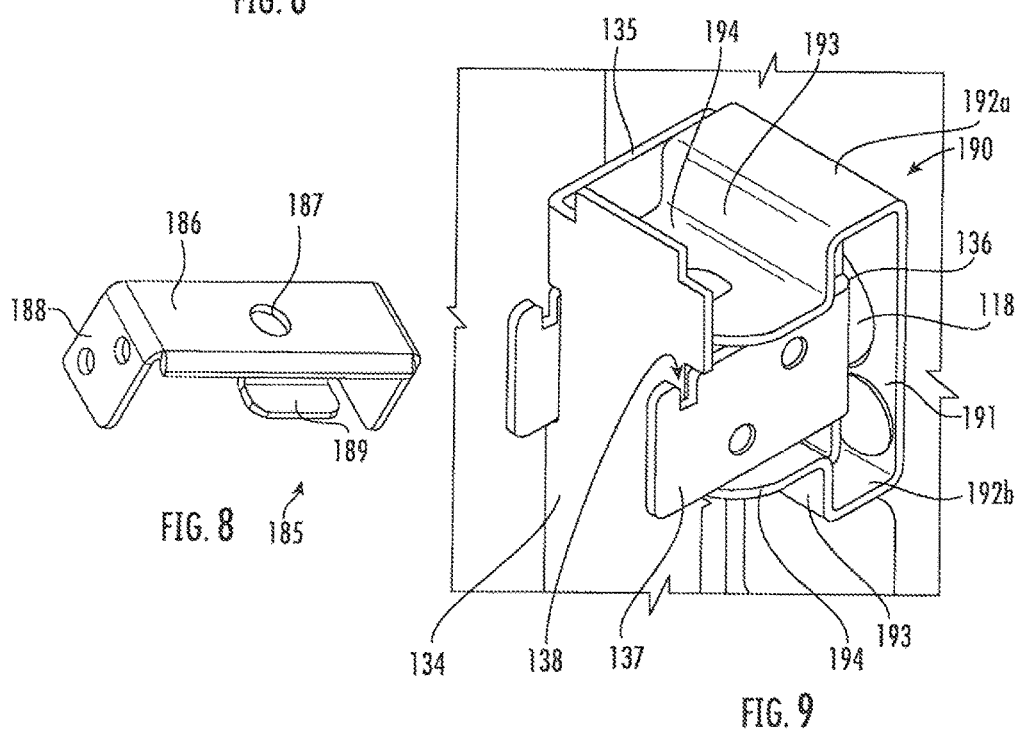

SECURITY SYSTEM FOR ELECTRONICS CABINET

RELATED APPLICATION

The present application claims priority from and the benefit of U.S. Provisional Patent Application No. 62/507,280, filed May 17, 2017, the disclosure of which is hereby incorporated herein in its entirety.

FIELD OF THE INVENTION

The present invention relates generally to cabinets, and more specifically to electronics cabinets.

BACKGROUND

Outdoor electronic cabinets have become popular in recent years. They can protect a wide range of electronic equipment including radios, multicarrier power amplifiers (MCPA), power suppliers, batteries, and wireless cell site backhaul equipment. These cabinets can protect base station equipment from environmental conditions while minimizing operating expenses and energy consumption.

Typically, electronics cabinets include one or two doors mounted to the front of the cabinet to provide access to components positioned within the front portion of the cabinet. Such cabinets also typically include one or more removable panels that form much of the rear wall of the cabinet to permit access to the rear of the cabinet. These panels, which are often mounted with two "quarter-turn" latches, can be removed separately to enable access to a specific area within the rear of the cabinet.

Unfortunately, electronics cabinets are often targets for theft and vandalism, with batteries being a particularly attractive commodity. Thieves often use crow bars or other prying implements to force the rear panels off of their mounting locations. As such, cabinet manufacturers have produced locking systems that prevent unwanted removal of the rear panels.

One approach includes brackets or hasps mounted adjacent to the quarter-turn latches. A cover encloses the latches and hasps, and a padlock secures the cover in place. Only by unlocking the padlock and removing the cover can the underlying quarter-turn latch be rotated so that the panel can be removed. This approach is generally successful, but requires that each individual padlock for each panel to be removed to allow full access to the rear of the cabinet. Some cabinets may have as many as four rear panels, thereby requiring eight different padlocks. As a result, removal of the panels can be time-consuming. In addition, the use of eight separate locks can be expensive, and if the locks are designed to have matching keys or combinations for simplicity, the cost may rise even more. As such, it may be desirable to provide a protective mechanism that requires less effort to access the entirety of the rear of the cabinet.

BRIEF DESCRIPTION OF THE FIGURES

FIG. 6 is a rear perspective view of the cover of the security system of FIG. 3.

FIG. 7 is front perspective view of the cover of FIG. 6.

FIG. 8 is a front perspective view of the hasp of the cover of FIG. 6.

FIG. 9 is a roar perspective view of the inner bar of the security system half of FIG. 3 mounted on a hasp on a rear panel of the electronics cabinet of FIG. 1.

DETAILED DESCRIPTION

Figure 1:
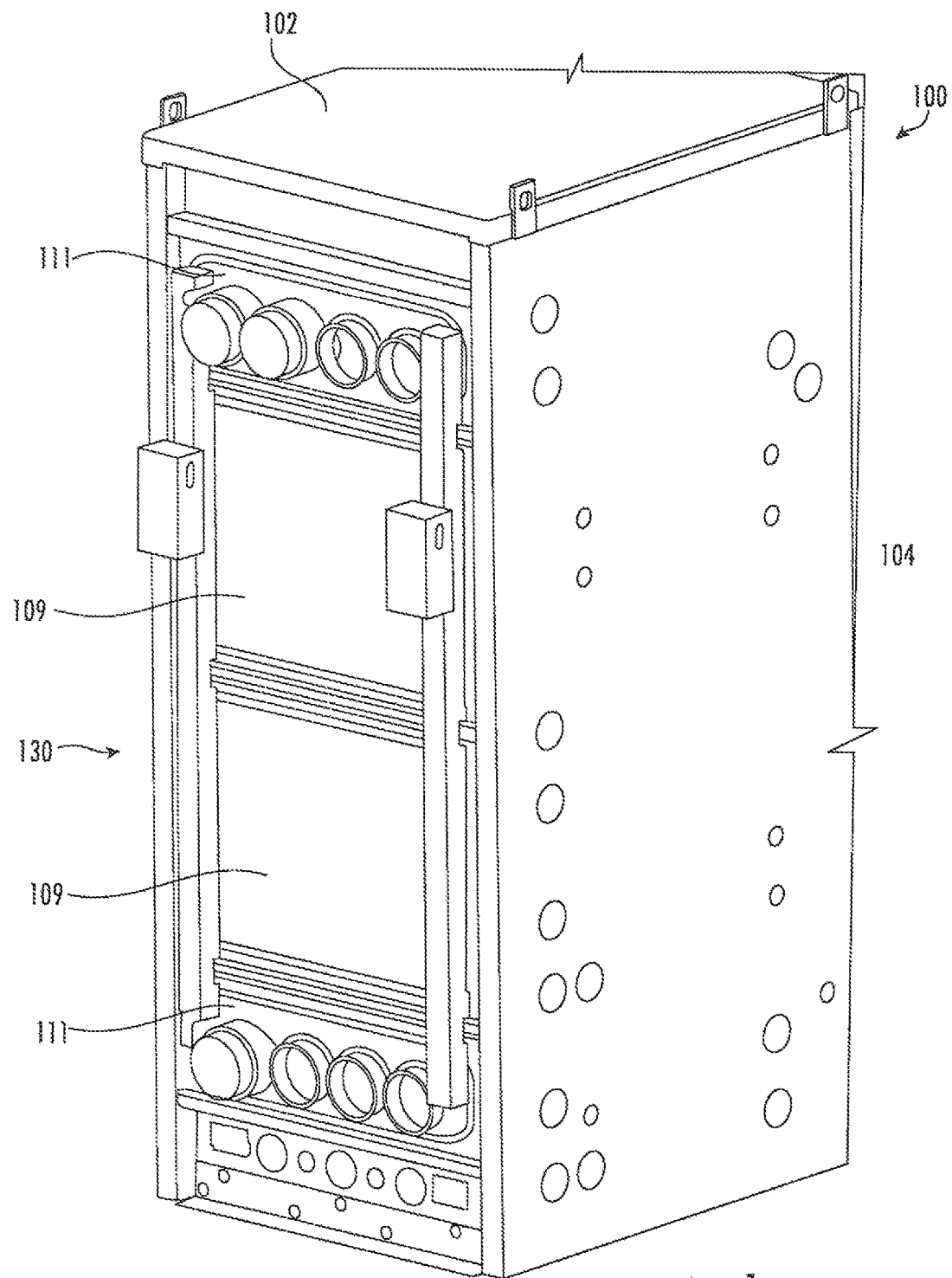
FIG. 1 is a rear perspective view of an electronics cabinet with a security system according to embodiments of the invention.

The present invention is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used, herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Figure 2:
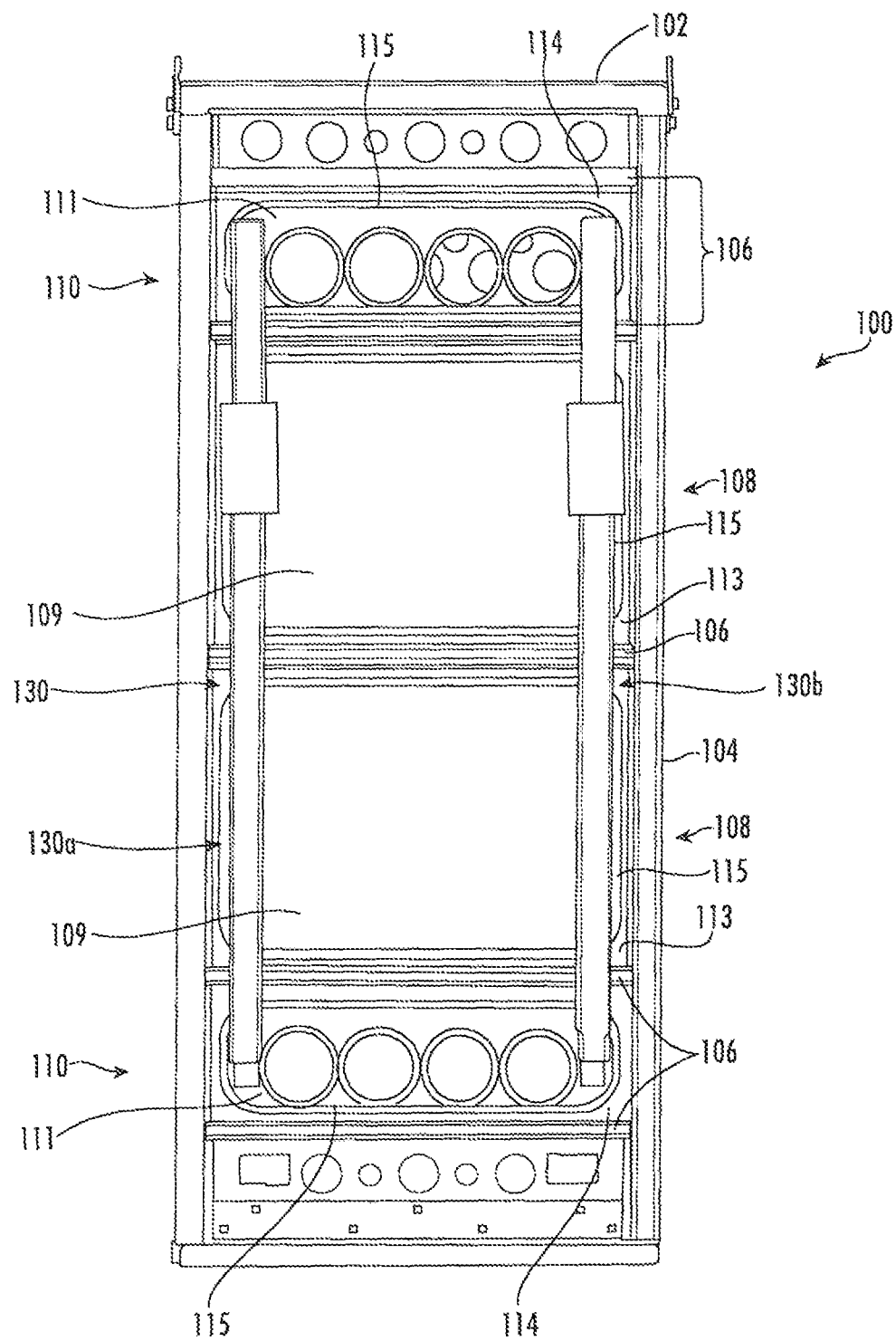
FIG. 2 is a rear view of the electronics cabinet and security system of FIG. 1.

Referring now to the drawings, an electronics cabinet, designated broadly at 100, is shown in FIGS. 1 and 2. The cabinet 100 is generally box-shaped, with a ceiling 102, side walls 104, a floor and a front wall that may include a door (these are not shown herein). The rear of the cabinet 100 is divided into six sections by five cross-members 106. Of these sections, two large sections 108 and two smaller sections 110 include respective generally rectangular panels 109, 111. Each of the panels 109, 111 is mounted to and removable from a respective frame 113, 114; a sealing gasket 115 lines a window in each frame 113, 114 to provide a seal when the panels 109, 111 are mounted therein.

Each of the panels 109, 111 is mounted in place via two quarter-turn latches 118 (see FIG. 9). The quarter-turn latches 118 are of conventional construction and need not be described in detail herein.

As described above, cabinets such as the cabinet 100 are susceptible to vandalism and theft. FIGS. 1 and 2 illustrate a security system 130 that protects the cabinet 100 from unwanted entry through the rear panels 109, 111. The security system 130 includes left and right halves 130a, 130b that are mirror images of each other about a vertical plane that divides the cabinet 100 from front to back. As such, only the half 130a will be described in detail herein, with the understanding that the discussion applies to the other half 130b also.

Figures 3, 4, 5:
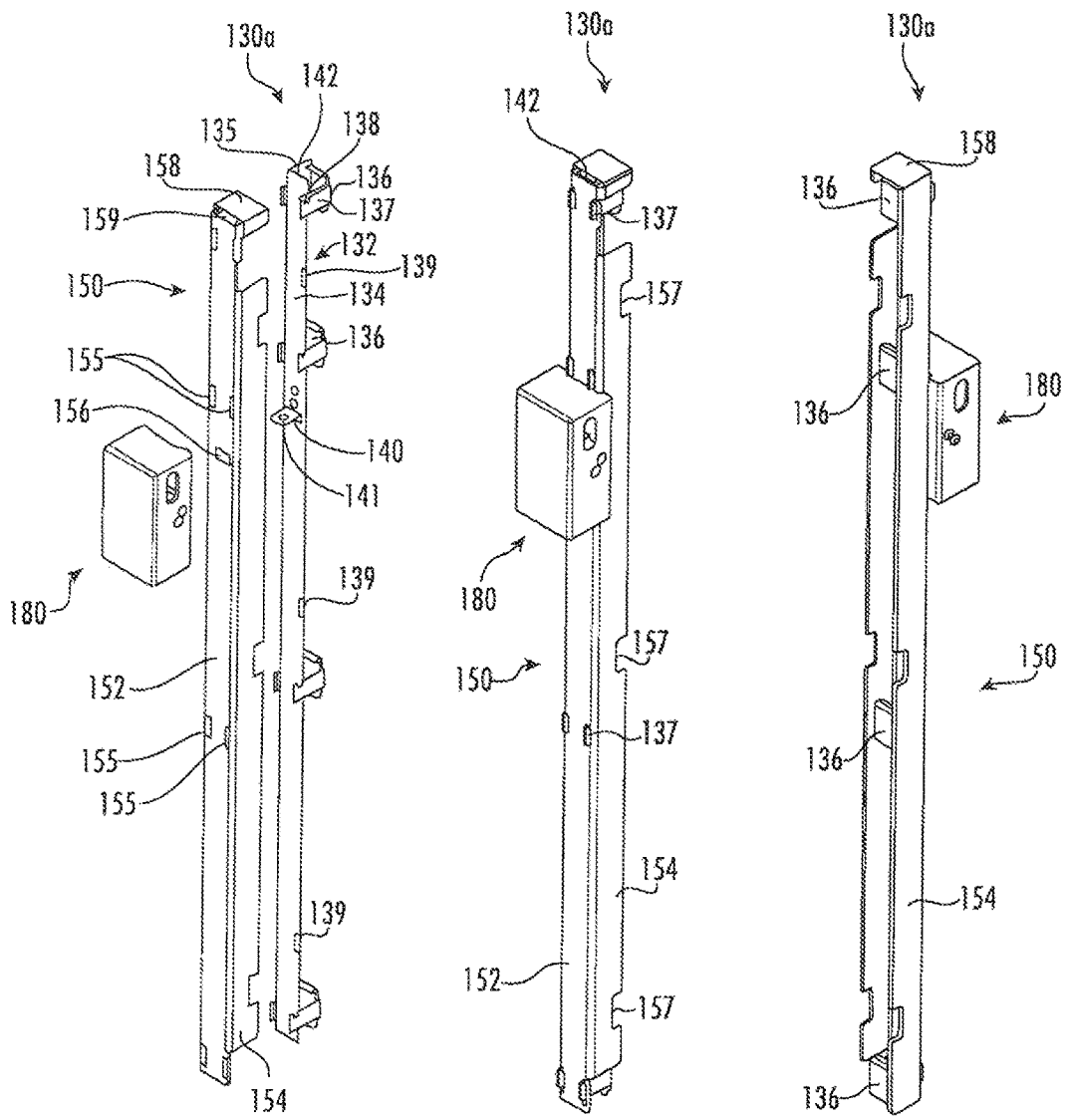
FIG. 3 is an exploded rear perspective view of the left half of the security system shown in FIGS. 1 and 2.
FIG. 4 is a rear perspective view of the security system half shown in FIG. 3.
FIG. 5 is a front perspective view of the security system half shown in FIG. 3.
Figure 10:
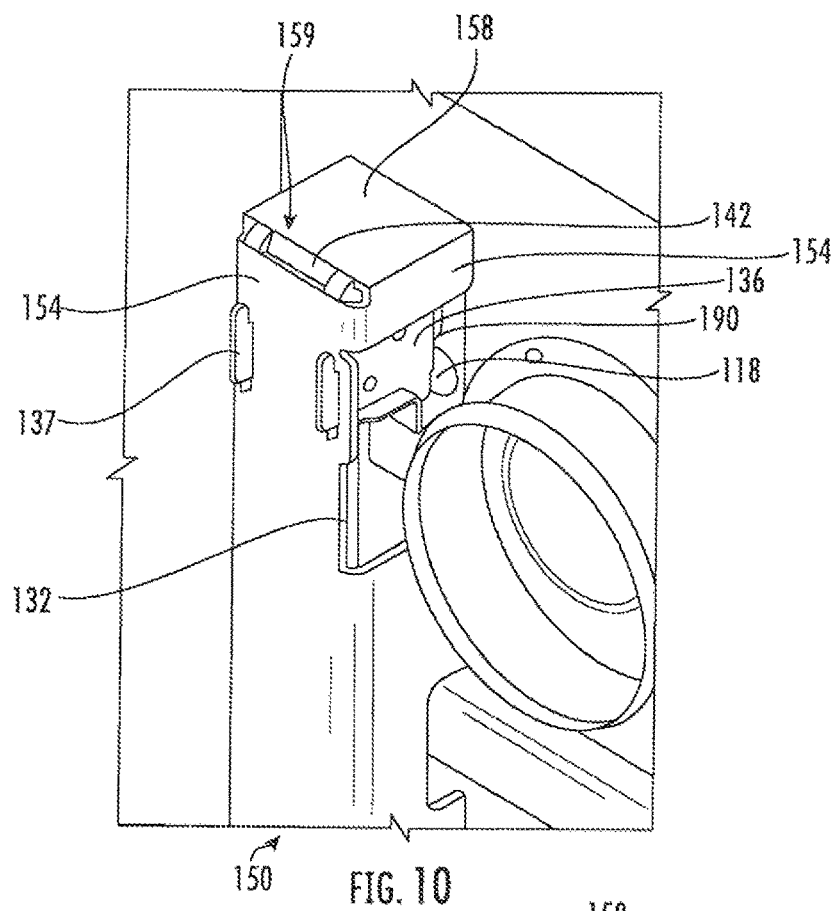
FIG. 10 is a partial view of the top portion of the security system half of FIG. 3 showing the outer channel mounted to the hasp and inner bar of FIG. 9.
Figure 11:
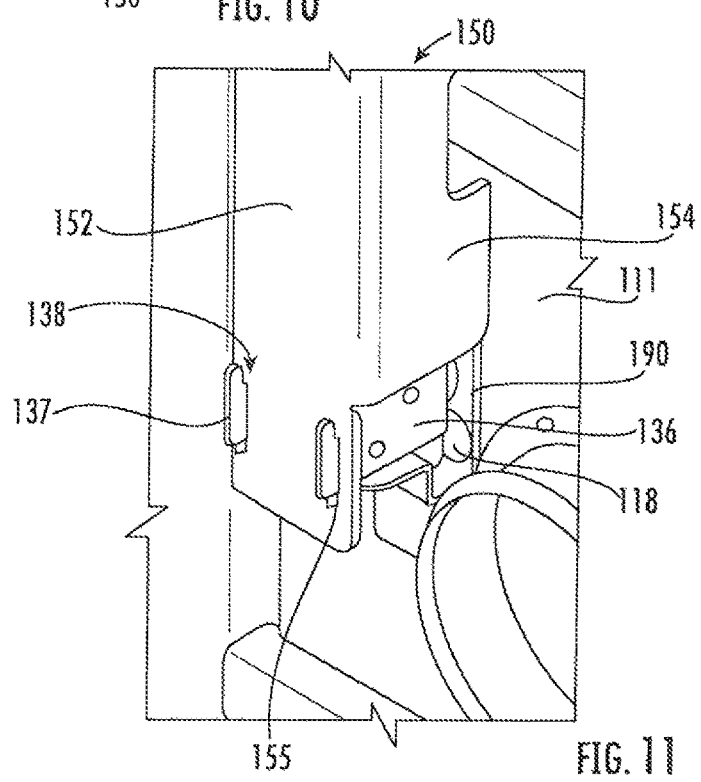
FIG. 11 is a partial view of the bottom portion of the security system half of FIG. 3 showing the outer channel mounted to a hasp and the inner bar.

Referring to FIGS. 3-5, the left half 130a of the security system 130 includes an inner bar 132, an outer channel 150, and a cover 180. The inner bar 132 is elongated and generally L-shaped in cross-section, with a front panel 134 and a side panel 135. Four C-shaped brackets 136 are mounted to the side panel 135, and have fingers 137 with slots 138 positioned in front of the front panel 134 (see also FIG. 9). The side panel 135 also has three recesses 139 in its front edge. A tongue 140 with a hole 141 extends rearwardly from a position slightly below the second-highest C-shaped bracket 136 (see also FIG. 13). Also, a tab 142 extends upwardly from the upper end of the front panel 134 (see also FIG. 10).

The outer channel 150 is also elongate and is generally U-shaped in cross-section, with a rear wall 152 and side walls 154. The rear wall 152 includes four sets of vertical slots 155, and further includes a horizontal slot 156. The side walls 154 include three recesses 157 each in their front edges. The outer channel 150 also includes a top wall 158. A slot 159 is located near or at the intersection of the front and top walls 153, 158 (see also FIG. 10).

Referring to FIGS. 6 and 7, the cover 180 is generally box-shaped, with a rear wall 181, side walls 182, and a ceiling 183; the lower end of the cover 180 is open, as is much of the front of the cover 180. Oval holes 184 are present in the upper portions of the side walls 182. A hasp 185 (FIGS. 7 and 8) includes an upper panel 186 with a hole 187 and side walls 188 that are mounted to the inner surfaces of the side walls 182 of the cover 180. A tab 189 extends forwardly from just below the upper panel 186.

As shown in FIG. 9, each of the quarter-turn latches 118 of the cabinet 100 is mounted within a hasp 190. Each hasp 190 is, generally C-shaped, with a front wall 191 mounted to a respective rear panel 109, 111 of the cabinet 100, horizontal upper and lower runs 192a, 192b, and fingers 193 that extend vertically from each run 192a, 192b, with the result that a T-shaped space is created within the hasp 190. Flanges 194 extend rearwardly from fingers 193.

The left half 130a of the security system 130 can be mounted onto the cabinet 100 as follows. First, the inner bar 132 is oriented vertically and positioned to the left of the hasps 190, with the C-shaped brackets 136 aligned with the hasps 190. The inner bar 132 is slid generally parallel to the rear panels 109, 111 to the right such that the upper and lower edges of each C-shaped bracket 136 are captured between the rear panel 109, 111 and the fingers 193 of its corresponding hasp 190, and the flanges 194 of the hasp 190 capture, the fingers 137 of the C-shaped bracket 136 (see FIG. 9). The recesses 139 in the front edges of the inner bar 132 receive the cross-members 106 of the cabinet 100.

Next, the outer channel 150 is oriented vertically and positioned to overlie the inner bar 132. The fingers 137 of each C-shaped bracket 136 are slipped through the vertical slots 155 so that the outer channel 150 rests in the slots 138. The tongue 140 is slipped through the horizontal slot 156 (see FIGS. 12 and 13). The slot 159 of the outer channel 150 receives the tab 142 of the inner bar 132. This placement of the outer channel 150 over the inner bar 132 positions the side walls 154 outside of the inner bar 132 and therefore prevents the inner bar 132 from sliding laterally; thus, the presence of the outer channel 150 overlying the inner bar 132 maintains the inner bar 132 in place within the hasps 190.

Figure 12:
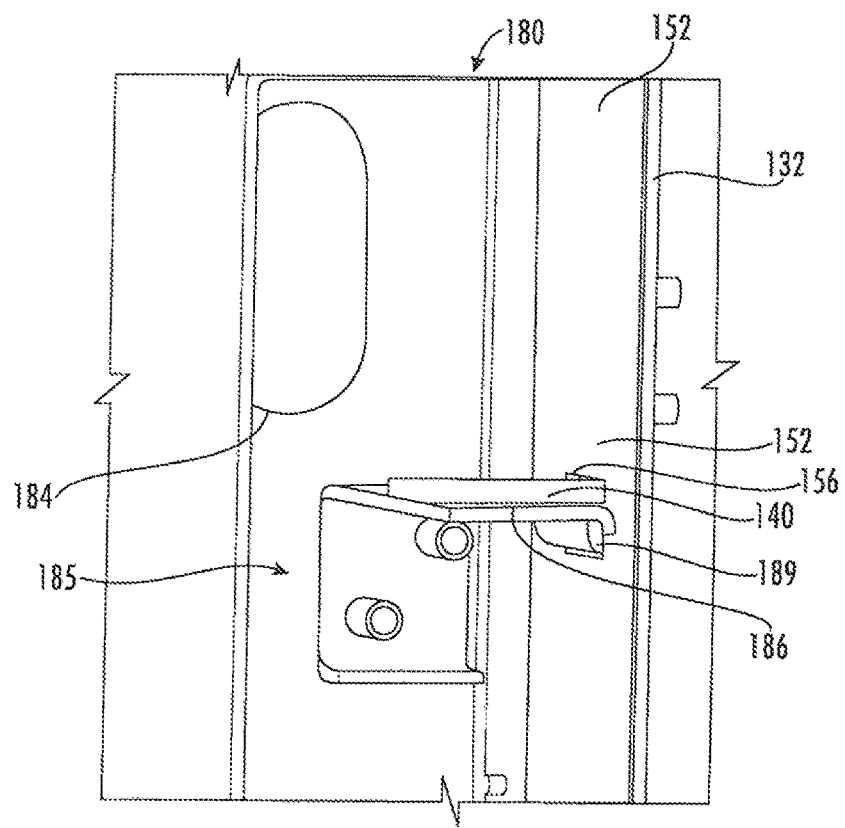
FIG. 12 is a rear perspective section view of the cover, outer channel and inner bar of the security system half of FIG. 3 in an assembled condition prior to the insertion of a lock.
Figure 13:
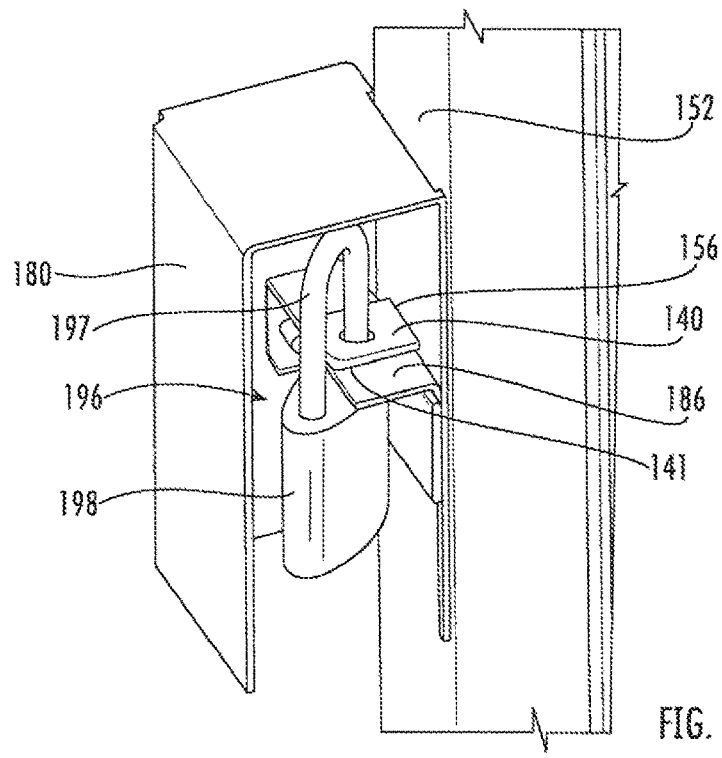
FIG. 13 is a rear perspective section view of the cover and outer channel of FIG. 12 with a lock in place.

The cover 180 is then applied over the portion of the outer channel 150 that is near the slot 156 and tongue 140 (see FIGS. 4, 12 and 13). More specifically, the cover 180 is positioned so that the tongue 140 is above the upper panel 186 of the hasp 180, and the tab 189 is inserted into the horizontal slot 156. This positioning aligns the holes 187, 141 of the hasp 185 and the tongue 140.

Finally, as can be seen in FIG. 13, a conventional padlock 196 (e.g., a key or combination lock, although other locking devices may be used) with a body 198 and a looped shackle 197 is inserted into the cover 180 from beneath. The shackle 197 should be unlocked. The padlock 196 is raised until the shackle 197 is above the tongue 140. The shackle 197 can be rotated until its free end is over the holes 187, 141. The free end of the shackle 197 is inserted through the holes 187, 141, and the body of the padlock 196 is rotated into position for locking with the shackle 197. The oval holes 184 of the cover 180 provide access to an operator to manipulate the position of the shackle 197.

The attachment of the lock 196 through the tongue 140 and the hasp 185 of the cover 180 secures the cover 180, the outer channel 150 and the inner bar 132 together. As noted previously, the inner bar 132 is prevented from relative movement with the cabinet 100 by the presence of the outer channel 150. Thus, in a locked condition the left half 130a of the security system 130 prevents access to the quarter-turn latches 118 on the left side of the rear panels 109, 111 to unauthorized personnel. Similarly, the right half 130a of the security system 130 can be applied over the quarter-turn latches 118 on the right side of the rear panels 109, 111, with the exception that the inner bar 132 of the right half 130a enters the hasps 190 from the right side rather than from the left (i.e., the inner bar 132 slides left into the hasps 190).

The cabinet 100 can be unlocked by reversing the process described above. The lock 196 is unlocked, with the body 198 of the lock 196 being separated from one of the arms of the shackle 197. The shackle 197 is lifted from the hasp 185 and tongue 140, which allows the cover 180 to be removed. The outer channel 150 is then raised slightly to lift the slot 159 above the tab 142 and to allow the edges of the vertical slots 155 to clear the slots 138 in the fingers 137. The outer channel 150 is then removed from the inner bar 132, which frees the inner bar 132 to be slid laterally to dislodge the C-shaped brackets 136 from the hasps 190. Removal of the inner bar 132 exposes the quarter-turn latches 118 of the panels 109, 111, which can be rotated in conventional manner to release whichever panel 109, 111 is to be removed.

Those of skill in this art will appreciate that the cabinet 100 and security system 130 may take other forms. For example, the cabinet 100 may have more or fewer rear panels 109, 111, although the security system 130 can be used with any number of panels. Securing fasteners other than quarter-turn latches may be used, such as spring-loaded latches or like; the security system 130 can be used with any securing fasteners that the security system 130 can fit over and thereby deny access to. The shapes and/or arrangements of the rear panels 109, 111 may vary. Other variations may also be suitable for use. Engagement features other than the hasps 190 may be used to enable the cabinet 100 to engage the security system 130.

In addition, the security system 130 may take different configurations. For example, the cover 180 may include a magnet to facilitate assembly. As another example, rather than the outer channel sliding vertically relative to the inner bar for assembly and disassembly, the outer channel 150 may pivot relative to the inner bar 132. As a specific example, the outer channel 150 may include a pin at its lower end that fits into a slot in the lower end of the inner bar 132. When the cover of the security system 130 is removed, the outer channel 150 rotates away from the inner bar 132 about an axis defined by the pin. Once the outer channel 150 has rotated and is removed, the inner bar 132 can be slid away from the hasps mounted on the cabinet 100 in the manner described above.

Figure 14:
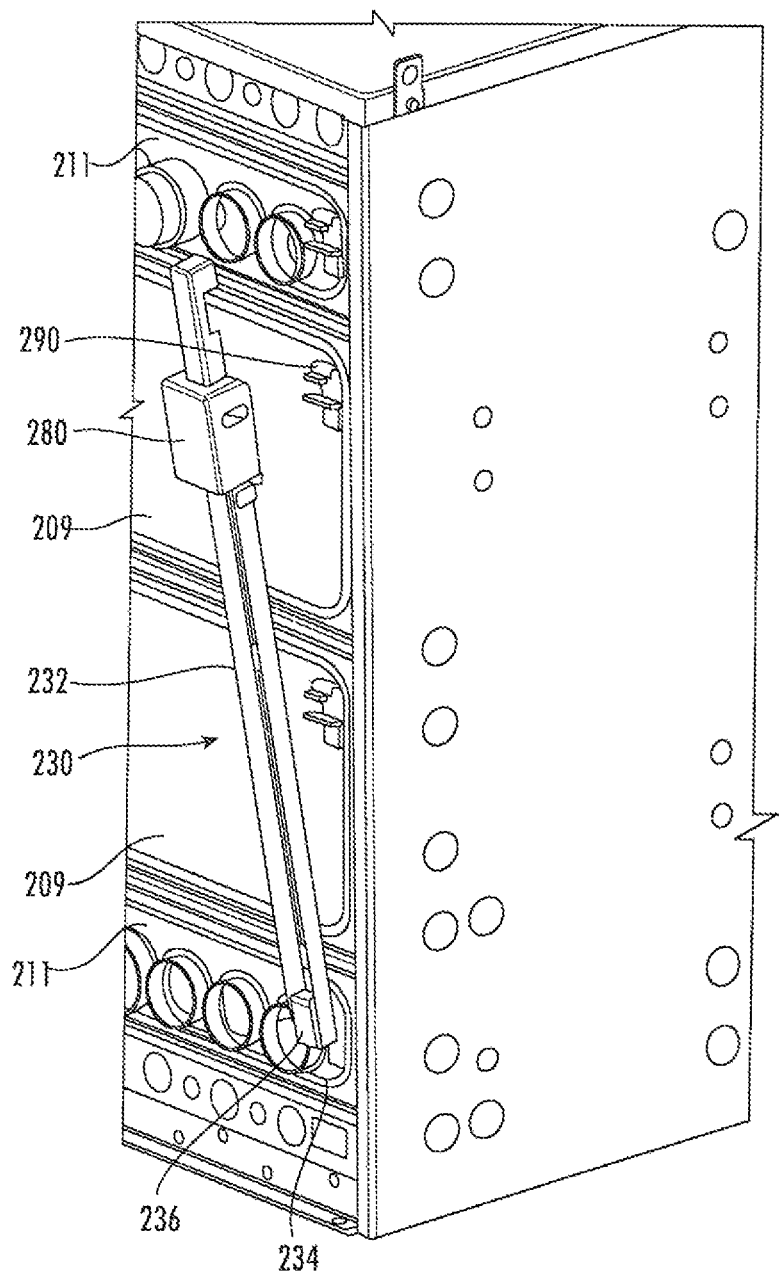
FIG. 14 is a rear perspective view of an electronics cabinet with a security system according to alternative embodiments of the invention, the security system shown in an unlocked condition.
Figure 15:
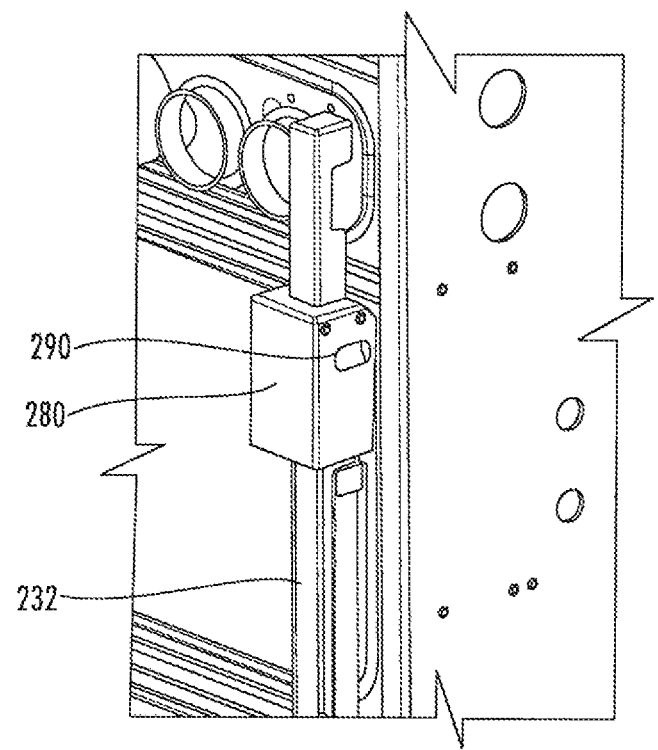
FIG. 15 is a rear perspective view of the top portion of the security system of FIG. 14 shown in a locked condition.
Figure 16:
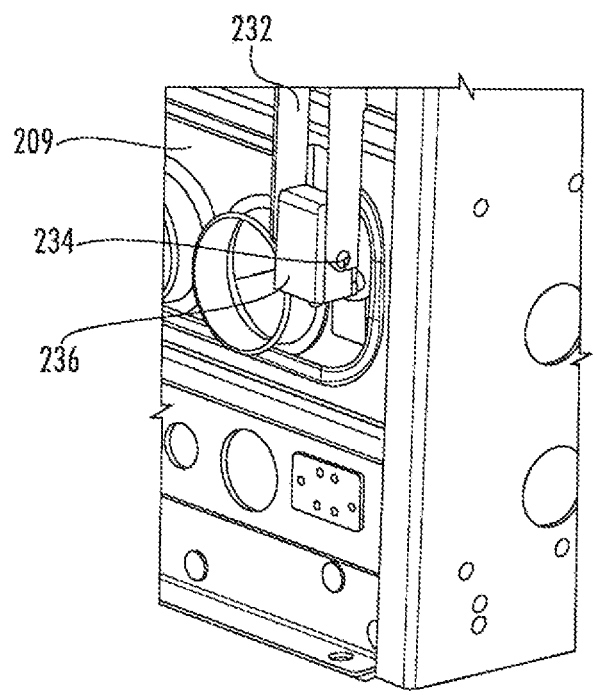
FIG. 16 is a rear perspective view of the bottom portion of the security system of FIG. 14 shown in a locked condition.

This type of pivoting configuration can also be applied to a security system that utilizes a single inner member and a cover (rather than an inner member, an outer member, and a cover as shown above). An example of such a configuration is shown in FIGS. 14-16 and designated at 230. In this configuration, an inner link 232 is attached at its lower end via a pin 234 to a box-type bracket 236. A cover 280 similar to the cover 180 described above is mounted to the inner link 232 near its upper end. The inner link 232 is of sufficient length to cover all of the quarter turn latches used to secure the rear panels 209, 211. A lock (not shown) resides within the cover 280 and secures the cover 280 and inner link 232 to a hasp 290 mounted on one of the rear panels 211 when the security system 230 is in its locked condition. As a result, all of the quarter-turn latches of the rear panels 209, 211 are covered when the security system 230 is in its locked condition. The rear panels 209, 211 can be accessed by unlocking the lock and freeing it from the hasp 290 as described above, then rotating the inner link 232 and cover 280 about the pin 234 to provide room to access the quarter-turn latches on the rear panels 209, 211.

Figure 17:
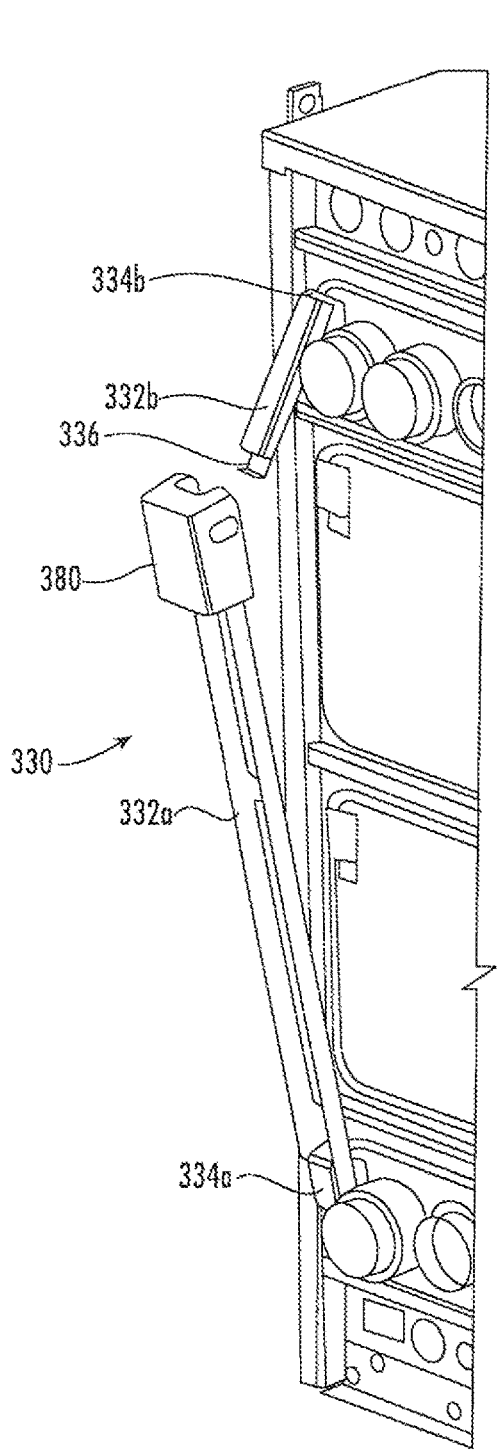
FIG. 17 is a rear perspective view of an electronics cabinet with a security system according to additional embodiments of the invention, the security system shown in an unlocked condition.
Figure 18:
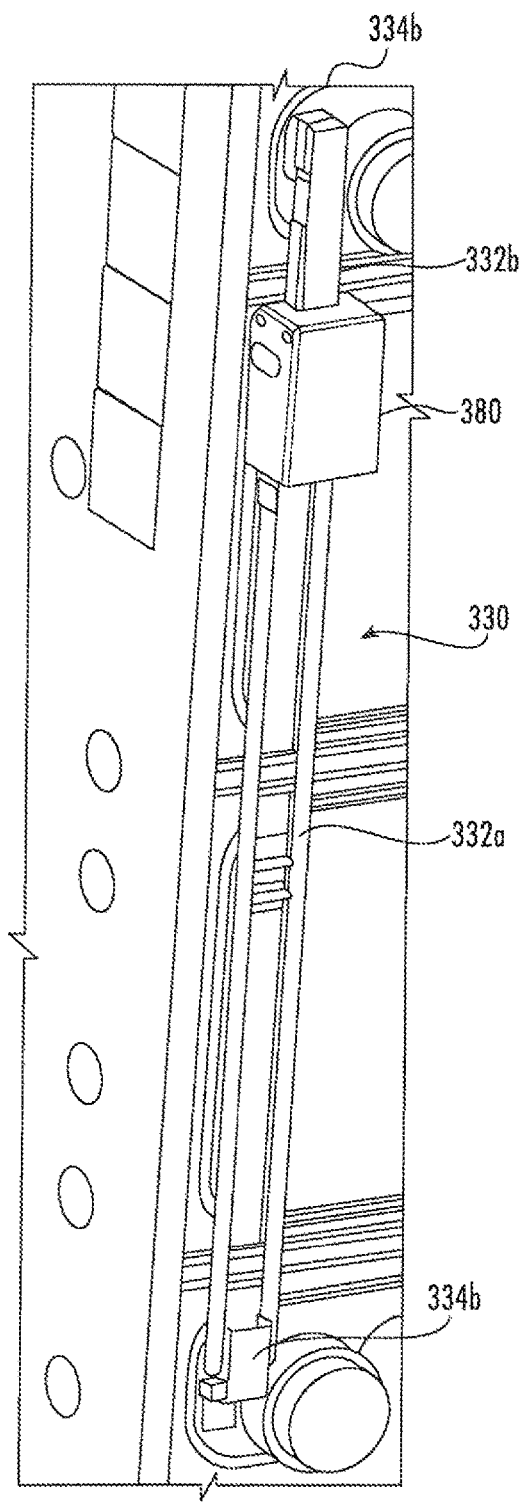
FIG. 18 is a rear perspective view of the security system of FIG. 17 shown in a locked condition.

A security system similar to the system 230 is shown in FIGS. 17 and 18 and designated at 330. The system 330 utilizes two inner links 332a, 322b that are pivotally attached to brackets 334a, 334b mounted on rear panels 309. A cover 380 is attached to the inner link 332a. The inner link 332b has a tongue 336 on its lower end that includes a hole positioned to align with a hole in the hasp of the cover 380. As such, when the inner links 332a, 332b are rotated to the position shown in FIG. 18, the tongue 336 overlies the hasp of the cover 380 to enable the insertion of a lock through the aligned holes in the tongue 336 and hasp. As a result, all of the quarter-turn latches of the rear panels 309, 311 are covered when the security system 330 is in its locked condition. The rear panels 309, 311 can be accessed by unlocking the lock and freeing it from the hasp of the cover as described above, then rotating the inner links 332a, 332b as needed to provide access the quarter-turn latches on the rear panels 309, 311.

In addition to the different embodiments shown above, those of skill in this art will appreciate that other configurations of security system assemblies that can overlie the quarter-turn latches or other securing fasteners of the rear panels in a locked condition may also be suitable for use.

The invention being thus described, it will be apparent that the same may be varied in many ways. Such variations are not to be regarded as a departure from the spirit and scope of the invention, and all such modifications as would be obvious to one skilled in the art are to be included within the scope of the following claims.

That which is claimed is:

1. An electronics cabinet, comprising:
   front, rear and side walls, wherein the rear wall includes first and second removable panels, the first and second removable panels being mounted to the rear wall with securing fasteners; and
   a security system for preventing removal of the first and second removable panels, comprising:

an assembly that overlies a securing fastener of the first panel and a securing fastener of the second panel; and a locking device engaging the assembly, the locking device configured to move between locked and unlocked conditions, wherein in the locked condition the locking device prevents removal of the assembly from the first and second rear panels, and in the unlocked condition the locking device permits the removal of the assembly from the first and second rear panels;

wherein the assembly comprises an inner member that engages an engagement feature on the rear wall, an outer member that overlies the inner member and prevents disengagement of the inner member from the engagement feature and a cover that covers and protects the locking device, wherein in the locked condition the locking device engages the inner member.

2. The electronics cabinet defined in claim 1, wherein the engagement feature comprises a hasp mounted to the first rear panel.

3. The electronics cabinet defined in claim 2, wherein the hasp is generally C-shaped, and wherein the inner member includes a bracket that is configured to be received by the hasp.

4. The electronics cabinet defined in claim 3, wherein hasp and bracket are configured such that the bracket slides into engagement with the hasp in a direction parallel with the first rear panel.

5. The electronics cabinet defined in claim 1, wherein the inner member includes a plurality of fingers that extend generally perpendicularly to the first rear panel, and the outer member includes slots that receive the plurality of fingers as the outer member overlies the inner member.

6. The electronics cabinet defined in claim 5, wherein the inner member has an upper end that includes a tab, and the outer member includes a slot that receives the tab of the inner member as the outer member overlies the inner member.

7. The electronics cabinet defined in claim 1, wherein inner member includes a tongue with a hole, the tongue extending rearwardly through a slot in the outer member as the outer member overlies the inner member.

8. The electronics cabinet defined in claim 7, wherein the cover includes a hasp with a hole, and wherein the hole in tongue of the inner member aligns with the hole in the hasp of the cover, and wherein the locking device extends through the hole in the tongue and the hole in the hasp in the locked condition.

9. The electronics cabinet defined in claim 1, wherein the locking device comprises a padlock having a body and a shackle.

10. The electronics cabinet defined in claim 9, wherein the shackle engages the cover and the inner member in the locked condition.

11. The electronics cabinet defined in claim 1, wherein the cover includes a magnet configured to attract the cover to the outer channel.

12. The electronics cabinet defined in claim 1, wherein the security system comprises an inner link that is pivotally attached to one of the rear panels and a cover that covers the locking device, the cover including a hasp, the locking device engaging the hasp.

13. The electronics cabinet defined in claim 12, wherein a second of the rear panels includes a hasp, and wherein the locking device engages the hasp of the second rear panel.

14. The electronics cabinet defined in claim 12, wherein the inner link is a first inner link, and further comprising a second inner link pivotally attached to a second of the rear panels, and wherein the locking device engages the second inner link and the hasp of the cover.

15. The electronics cabinet defined in claim 1, wherein the rear wall further comprises third and fourth removable panels, the third and fourth removable panels being mounted to the rear wall with securing fasteners, and wherein the security system overlies the securing fasteners of the third and fourth panels in the locked condition.

16. An electronics cabinet, comprising:
front, rear and side walls, wherein the rear wall includes first and second removable panels, the first and second removable panels being mounted to the rear wall with securing fasteners; and
a security system for preventing removal of the first and second removable panels, comprising:
an assembly that overlies a securing fastener of the first panel and a securing fastener of the second panel; and
a locking device engaging the assembly, the locking device configured to move between locked and unlocked conditions, wherein in the locked condition the locking device prevents removal of the assembly from the first and second rear panels, and in the unlocked condition the locking device permits the removal of the assembly from the first and second rear panels;
wherein the security system comprises an inner link that is pivotally attached to one of the rear panels and a cover that covers the locking device, the cover including a hasp, the locking device engaging the hasp.

17. An electronics cabinet, comprising:
front, rear and side walls, wherein the rear wall includes first and second removable panels, the first and second removable panels being mounted to the rear wall with securing fasteners; and
a security system for preventing removal of the first and second removable panels, comprising:
an assembly that overlies a securing fastener of the first panel and a securing fastener of the second panel; and
a locking device engaging the assembly, the locking device configured to move between locked and unlocked conditions, wherein in the locked condition the locking device prevents removal of the assembly from the first and second rear panels, and in the unlocked condition the locking device permits the removal of the assembly from the first and second rear panels;
wherein the assembly comprises an inner member that engages an engagement feature on the rear wall, and a cover that covers and protects the locking device, wherein in the locked condition the locking device engages the inner member.

* * * * *

UNITED STATES PATENT AND TRADEMARK OFFICE
CERTIFICATE OF CORRECTION

PATENT NO. : 10,512,180 B2
APPLICATION NO. : 15/972652
DATED : December 17, 2019
INVENTOR(S) : Yeh et al.

Page 1 of 1

It is certified that error appears in the above-identified patent and that said Letters Patent is hereby corrected as shown below:

In the Claims

Column 7, Line 15, Claim 1: Please correct "feature and" to read -- feature, and --

Signed and Sealed this
Twenty-fifth Day of February, 2020

Andrei Iancu
*Director of the United States Patent and Trademark Office*